United States Patent [19]
Nagamoto

[11] Patent Number: 5,844,924
[45] Date of Patent: Dec. 1, 1998

[54] MAIN SIGNAL MEMORY SUPERVISORY CONTROL SYSTEM USING ODD-EVEN ALTERNATIVE CHECK

[75] Inventor: Mamoru Nagamoto, Tokyo, Japan

[73] Assignee: NEC Corportion, Japan

[21] Appl. No.: 956,862

[22] Filed: Oct. 24, 1997

[30] Foreign Application Priority Data

Oct. 25, 1996 [JP] Japan ................................. 8-284250

[51] Int. Cl.$^6$ ................................................. G06F 11/00
[52] U.S. Cl. ...................... 371/49.3; 371/49.1; 371/49.2; 371/5.3
[58] Field of Search ................................. 371/49.3, 49.2, 371/49.1, 48, 5.3

[56] References Cited

U.S. PATENT DOCUMENTS 3,179,921  4/1965  Arthur ....................................... 371/5.3
3,534,403  10/1970  Matarese ................................... 371/5.3

Primary Examiner—Phung M. Chung
Attorney, Agent, or Firm—Ostrolenk, Faber, Gerb & Soffen, LLP

[57] ABSTRACT

In a main signal memory supervisory control system which comprises a parity generator, a parity detector, a write address counter and a read address counter, a state management section, a down counter, and a change point detector are arranged as memory supervising means. In this memory supervisory, a state management section receives address generation notifications from the write address counter and the read address counter to calculate and outputs the data accumulation amount of the main signal memory, a down counter subtracts a counter by the read address, sets a predetermined value of a data amount in advance, outputs a change notification when a counter value changes from numerical value "1" to numerical value "0", and loads the predetermined value on the counter, and a change point detector sends an odd-even switching signal of a parity when the change point detector receives the change notification. As a result, an odd-even alternative switching operation for a supervisory parity can be performed even in a memory write system such as an ATM communication system using only effective data, so that supervisory performance for the main signal memory can be improved.

6 Claims, 6 Drawing Sheets

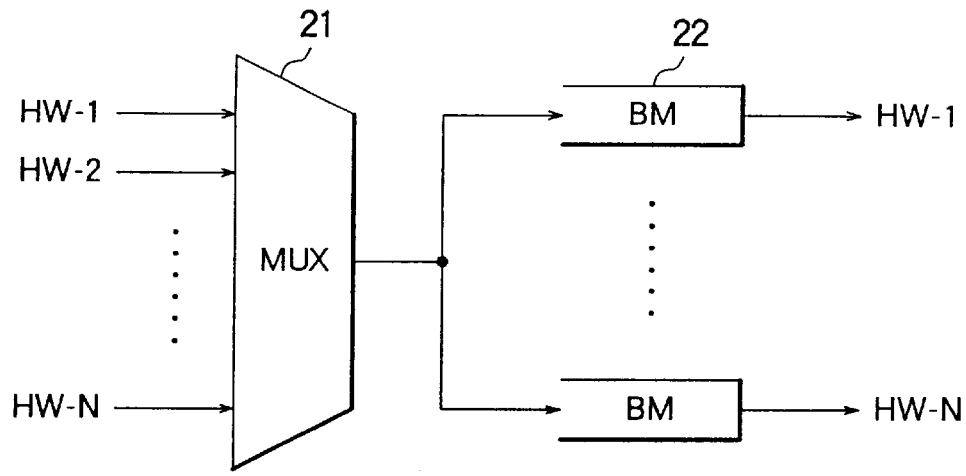
FIG. 6
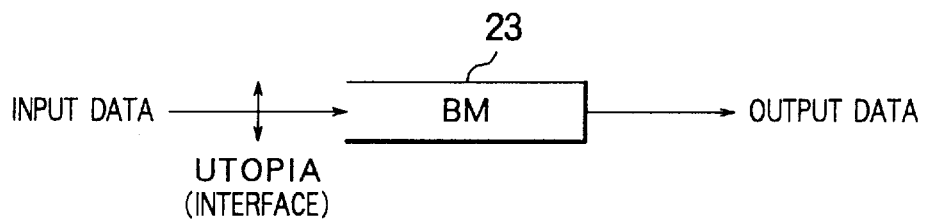
FIG. 7A
FIG. 7B

MAIN SIGNAL MEMORY SUPERVISORY CONTROL SYSTEM USING ODD-EVEN ALTERNATIVE CHECK

BACKGROUND OF THE INVENTION

The present invention relates to a main signal memory supervisory control system which controls a supervising operation for the main signal memory using an odd-even alternative check and more particularly, to a main signal memory supervisory control system which can perform an odd-even alternative check even in a system such as an ATM (Asynchronous Transfer Mode) communication system in which only effective data is stored in the main signal memory.

A memory which is generally used in a communication system, e.g., an SDH (Synchronous Digital Hierarchy) communication system is not a simple-function memory such as a store device used in an equipment such as a computer, but generally includes a switching operation function for distributing/collecting data in a plurality of memories. For this reason, an odd-even alternative check which alternatively switches a parity bit to an odd/even number is employed as the parity check described above.

Therefore, in a memory supervisory control system for always supervising data in a memory, a parity generator for outputting the signal added with a parity bit and switching the oddness/evenness of the added parity bit by an odd/even switching signal, on the write side, and a parity detector for detecting a parity bit from a signal read on the read side and receiving the odd-even switching signal to switch the oddness/evenness of the parity check, on the read side, are arranged. If the parity detector detects that the detected parity bit coincides with the parity bit added on the input side, normal data can be output, and it is determined that the memory is normal.

In the main signal memory supervisory control system using an odd-even alternative check used in a conventional SDH communication system, the odd-even alternative check cannot be performed to a memory supervisory operation for effective data only for realizing the functions of an ATM communication system and satisfying standard specifications of the ATM communication system, and the supervisory performance is degraded disadvantageously.

The reason why the above problem is posed is as follows. That is, input data to a conventional memory is allocated as actual communication data to a storage area of the memory regardless of the validity/invalidity of the data, and a read/write control operation alternately controls a memory supervisory parity as an odd/even number at a predetermined cycle. More specifically, in the odd-even alternative control performed for a memory supervisory parity at a simple cycle, when only effective data is asynchronously written in the memory as in the ATM communication system, the effective data changes depending on communication traffic. For this reason, a read timing must be changed depending on the generation timing and a generation amount of the effective data. Therefore, a memory supervising operation for the ATM communication system cannot be checked.

It is an object of the present invention to provide a main signal memory supervisory control system which performs an odd-even alternative switching operation for a supervisory parity even in a memory write system such as an ATM communication system using only effective data and can improve supervisory performance for a main signal memory, thereby solving the above problem.

SUMMARY OF THE INVENTION

A main signal memory supervisory control system for controlling a supervising operation for a main signal memory using an odd-even alternative check, comprising:

a parity generator for adding a parity bit to an input signal to output the signal and switching the oddness/evenness of the added parity bit by an odd-even switching signal on a write side of the main signal memory;

a parity detector for detecting a parity bit from a signal read to check the parity bit and receiving an odd-even switching signal to switch the oddness/evenness of the parity check on a read side of the main signal memory; and memory supervising means, including a down counter for subtracting a count value each time data is read from the main signal memory, for calculating a data accumulation amount of the main signal memory, loading the data accumulation amount on the counter when count value "1" changes into numerical value "0", and outputting the odd-even switching signal to the parity generator and the parity detector.

The memory supervising means with the above arrangement performs odd-even alternative switching control each time effective data whose number corresponds to the data accumulation amount in the main signal memory in an odd-even alternative switching operation are read.

In addition to the above arrangement, the memory supervising means sends the odd-even switching signal to only the parity detector in case that the data accumulation amount of the main signal memory is numerical value "0" at the time when count value "1" of the counter is changed into numerical value "0". When the data accumulation amount of the main signal memory reaches a predetermined value, the memory supervising means loads the predetermined value on the counter and sends the odd-even switching signal to the parity generator. Furthermore, the memory supervising means loads a value obtained by subtracting numerical value "1" from the predetermined value when data is read from the main signal memory at the same timing as the timing at which the data accumulation amount of the main signal memory reaches the predetermined value.

The memory supervising means with this arrangement sets the predetermined number of stored effective data to be read when the data accumulation amount of the main signal memory is numerical value "0" at a timing for odd-even alternative switching to cope with a supervising operation in a state wherein the accumulation amount is numerical value "0".

BRIEF DESCRIPTION OF THE DRAWINGS

FIG. 6 is a connection view showing the first application according to the present invention.

FIG. 7A and 7B show the second application according to the present invention.

DESCRIPTION OF THE PREFERRED EMBODIMENT

Figure 1A:
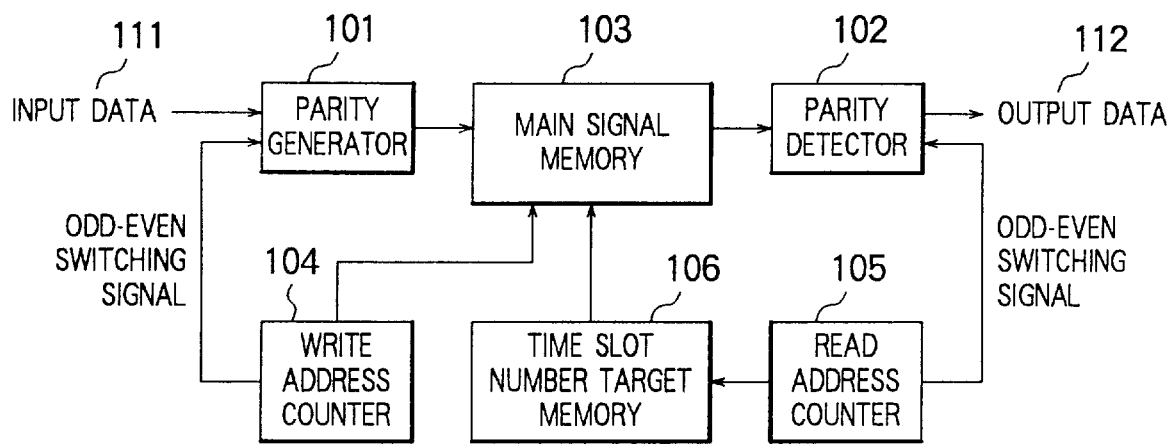
FIG. 1A is a block diagram showing a conventional main signal memory supervisory control system.

A conventional main signal memory supervisory control system using an odd-even alternative check of this type, as shown in FIG. 1A, a parity generator 101 adds a parity bit to input data 111, and the input data 111 is written in a main signal memory 103 by a write address generated by a write address counter 104.

On the other hand, the data written in the main signal memory 103 is read on the basis of an address corresponding to a time slot on the output side read from a time slot number target memory 106 by a read address generated by a read address counter 105. An input time slot number corresponding to an output time slot number for switching is stored in the time slot number target memory 106 to realize a time slot replacing circuit for time division switching.

Parity bit information included in the data read from the main signal memory 103 is compared with a parity bit of data formed again by logical development in a parity detector 102. If the comparison result is abnormal, it is detected that the main signal memory 103 is defective. The correct data is output from the parity detector 102 as the output data 112.

In the above operation procedure, the write address counter 104 and the read address counter 105 send odd-even switching signals to the parity generator 101 and the parity detector 102, respectively to perform a switching operation for determining whether a parity operation is performed as an odd parity or an even parity.

This odd-even switching signal is alternatively controlled at a predetermined cycle by an address counter in a synchronous system such as an SDH communication system.

Figure 1B:
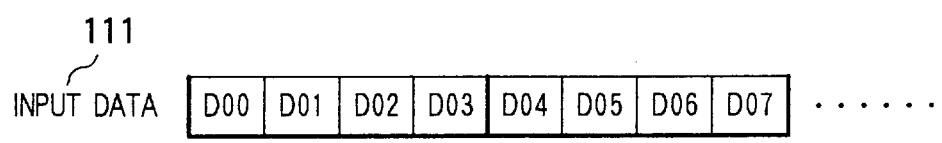
FIG. 1B is a timing chart of the main signal memory supervisory control system.
Figure 1B:
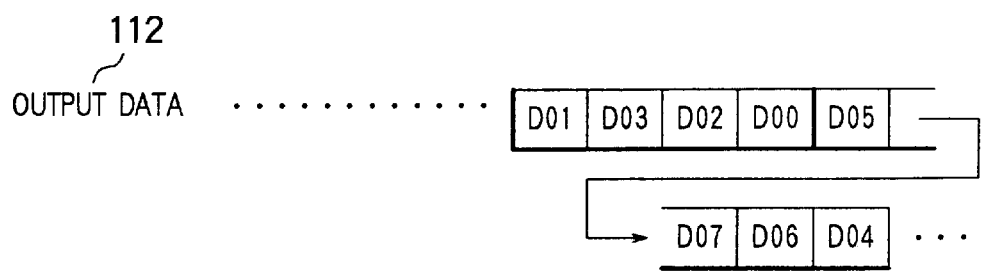

For example, as shown in FIG. 1B, when input data D00 to input data D07 are continuously input, replacement for data is performed in four-time-slot units on the basis of the contents of the data stored in the time slot number target memory 106 shown in FIG. 1A, and odd-even alternative control for parity bits based on this replacement is realized. More specifically, data D00, D01, D02, and D03 of the input data 111 are output as the data D01, D03, D02, and D00 of the output data 112 in correspondence with the slots of data D04, D05, D06, and D07 of the input data 111, and the D05, D07, D06, and D04 are output as the output data 112 in correspondence with slots following the above slots.

In this manner, the main signal memory for storing main signal data has supervisory precision which is improved by using an odd-even alternative check. Abnormality in the main signal memory of this type in the communication system can be detected by only a supervising operation using an odd-even alternative check.

An embodiment of the present invention will be described below with reference to the accompanying drawings.

Figure 2:
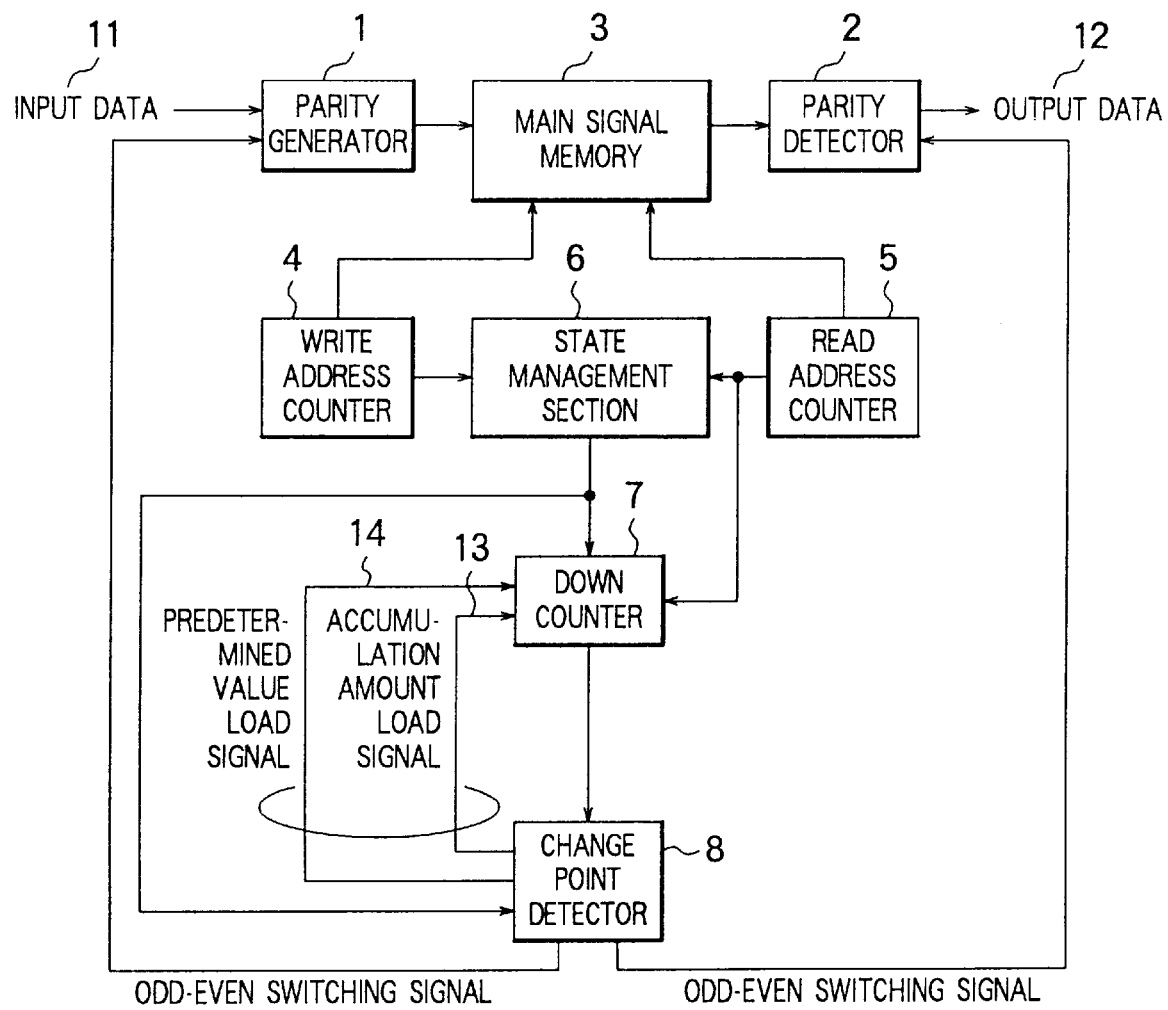
FIG. 2 is a functional block diagram showing one embodiment of a main signal memory supervisory control system according to the present invention.

FIG. 2 is a functional block diagram showing an embodiment of the present invention. In a main signal memory supervisory control system using an odd-even alternative check shown in FIG. 2, a parity generator 1, a parity detector 2, a main signal memory 3, a write address counter 4, a read address counter 5, a state management section 6, a down counter 7, and a change point detector 8 are arranged.

This main signal memory supervisory control system and a conventional main signal memory supervisory control system are different from each other with respect to the following points. That is, the state management section 6, the down counter 7, and the change point detector 8 are arranged as a memory supervising means, and an odd-even switching signal is output from the change point detector 8.

First, the constituent elements will be described below.

The parity generator 1 adds a parity bit based on an odd-even switching signal received from the change point detector 8 to effective data of received input data 11 to output the effective data to the main signal memory 3.

The parity detector 2 forms the logic of a parity bit based on the odd-even switching signal received from the change point detector 8 to compare the parity bit with the parity bit information of the data read from the main signal memory 3. If the comparison result is normal, the read data is output as output data. Otherwise, the main signal memory 3 is determined as a defective memory to perform a predetermined defective procedure.

The main signal memory 3 writes the effective data output from the parity generator 1 by a write address generated by the write address counter 4, and data read by an output address generated by the read address counter 5 is output to the parity detector 2.

The write address counter 4 generates a write address for writing data in the main signal memory 3 to output the write address, and notifies the state management section 6 of generation of the write address. The read address counter 5 generates a read address for reading data to output the read address to the main signal memory 3, and notifies the state management section 6 and the down counter 7 of generation of the read address.

When the state management section 6 receives the generation notification of the write address from the write address counter 4, the state management section 6 adds one to the counter thereof. When the state management section 6 receives the generation notification of the read address, the state management section 6 subtracts one from a counter thereof, and the data accumulation amount of the main signal memory 3 is measured to manage the accumulation state of the data. More specifically, the state management section 6 outputs the self-count values to the down counter 7 and the change point detector 8 as data accumulation amounts.

The down counter 7 receives the data accumulation amount of the main signal memory 3 from the state management section 6. When the down counter 7 receives an accumulation amount load signal 13 from the change point detector 8, the down counter 7 loads the data accumulation amount of the main signal memory 3 on the counter of the down counter 7. When the down counter 7 receives a predetermined value load signal 14, the down counter 7 loads the predetermined value of a predetermined data amount for switching the oddness/evenness of the parity bit on the counter of the down counter 7. On the other hand, when the down counter 7 receives the generation notification of a read address from the read address counter 5, the down counter 7 subtracts one from the count value thereof and outputs the count value to the change point detector 8. When the down counter 7 simultaneously receives the predetermined value load signal 14 and the generation notification of the read address, the count value becomes a value obtained by subtracting one from the predetermined value, and the value is output to the change point detector 8.

When the count value received from the down counter 7 changes from numerical value "1" to numerical value "0", the change point detector 8 sends the accumulation amount load signal 13 to the down counter 7 to load the data accumulation value of the main signal memory 3 and sends an odd-even switching signal to the parity generator 1 and the parity detector 2 to switch the odd/even number of the parity bit. However, in this case, when the data accumulation amount of the main signal memory 3 received from the state management section 6 is numerical value "0", the change point detector 8 stops sending of the odd-even switching signal to the parity generator 1 to set "accumulation amount zero mode".

Assume that the change point detector 8 stops the sending operation of the odd-even switching signal to the parity generator 1 to set the "accumulation amount zero mode" because the data accumulation amount is numerical value "0". In this case, when the data accumulation amount of the main signal memory 3 received from the state management section 6 detects a change point to a predetermined value, the change point detector 8 sends the odd-even switching signal to the parity generator 1 and sends the predetermined value load signal 14 to the down counter 7.

A main operation procedure in memory supervisory control when a write address is generated by the write address counter 4 will be described below with reference to FIGS. 3 and 2.

Figure 3:
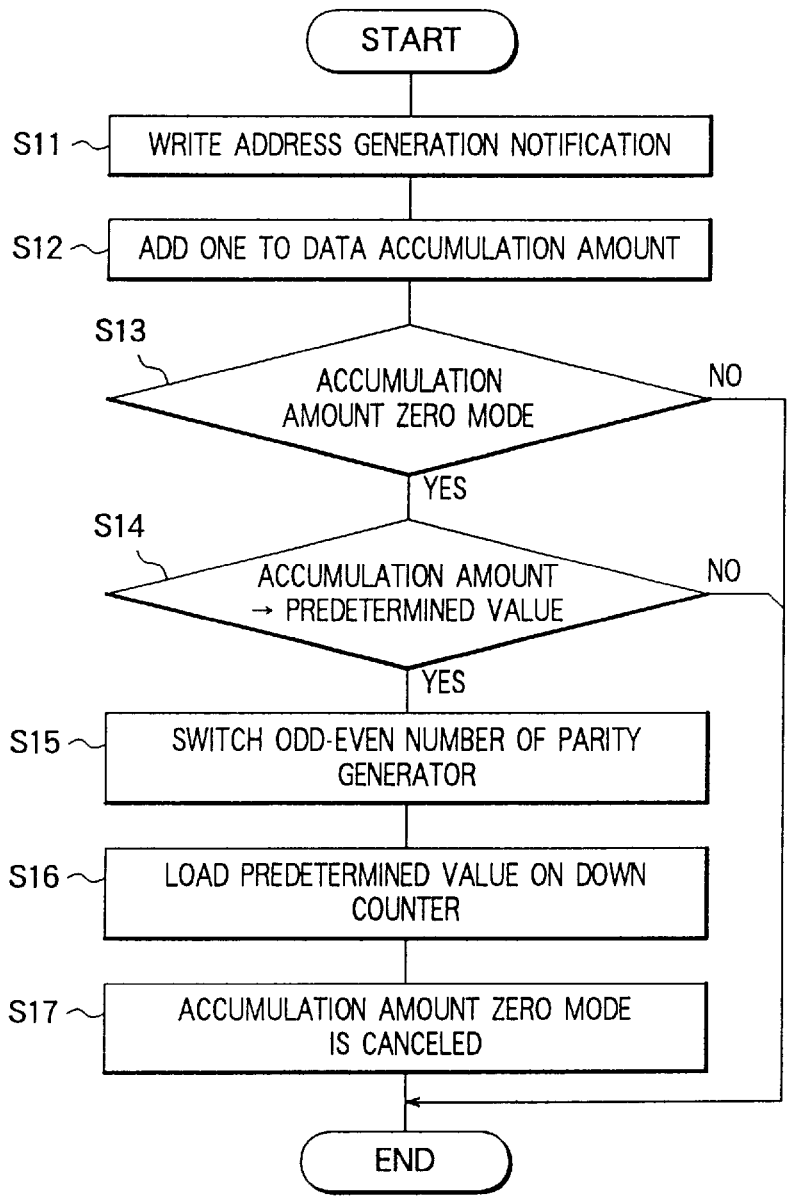
FIG. 3 is a flow chart showing one form of a main operation procedure in a write state in the main signal memory supervisory control system according to the present invention.

As shown in FIG. 3, when a write address generated by the write address counter 4, the state management section 6 receives a generation notification (step S11) and adds one to the data accumulation amount (step S12).

The change point detector 8 supervises the data accumulation amount of the state management section 6. If the data accumulation amount is not "accumulation amount zero mode" set when the data accumulation amount is numerical value "0", (NO in step S13), the procedure is temporarily ended. On the other hand, if YES in step S13, and if the "accumulation amount zero mode" is set, the change point detector 8 sends the odd-even switching signal to the parity generator 1 to switch the odd/even number of the parity (step S15) when the accumulation amount reaches a predetermined value by addition in step S12 (YES in step S14). At the same time, the change point detector 8 sends the predetermined value load signal 14 to the down counter 7 to load a predetermined value on the down counter 7 (step S16), setting of the "accumulation amount zero mode" is canceled (step S17), and the procedure is ended.

If the data accumulation amount does not reach the predetermined value (NO in step S14), the procedure is ended up to this, and the operation does not advance until the next event is generated.

A main operation procedure in memory supervisory control when a read address is generated will be described below with reference to FIGS. 4 and 2.

Figure 4:
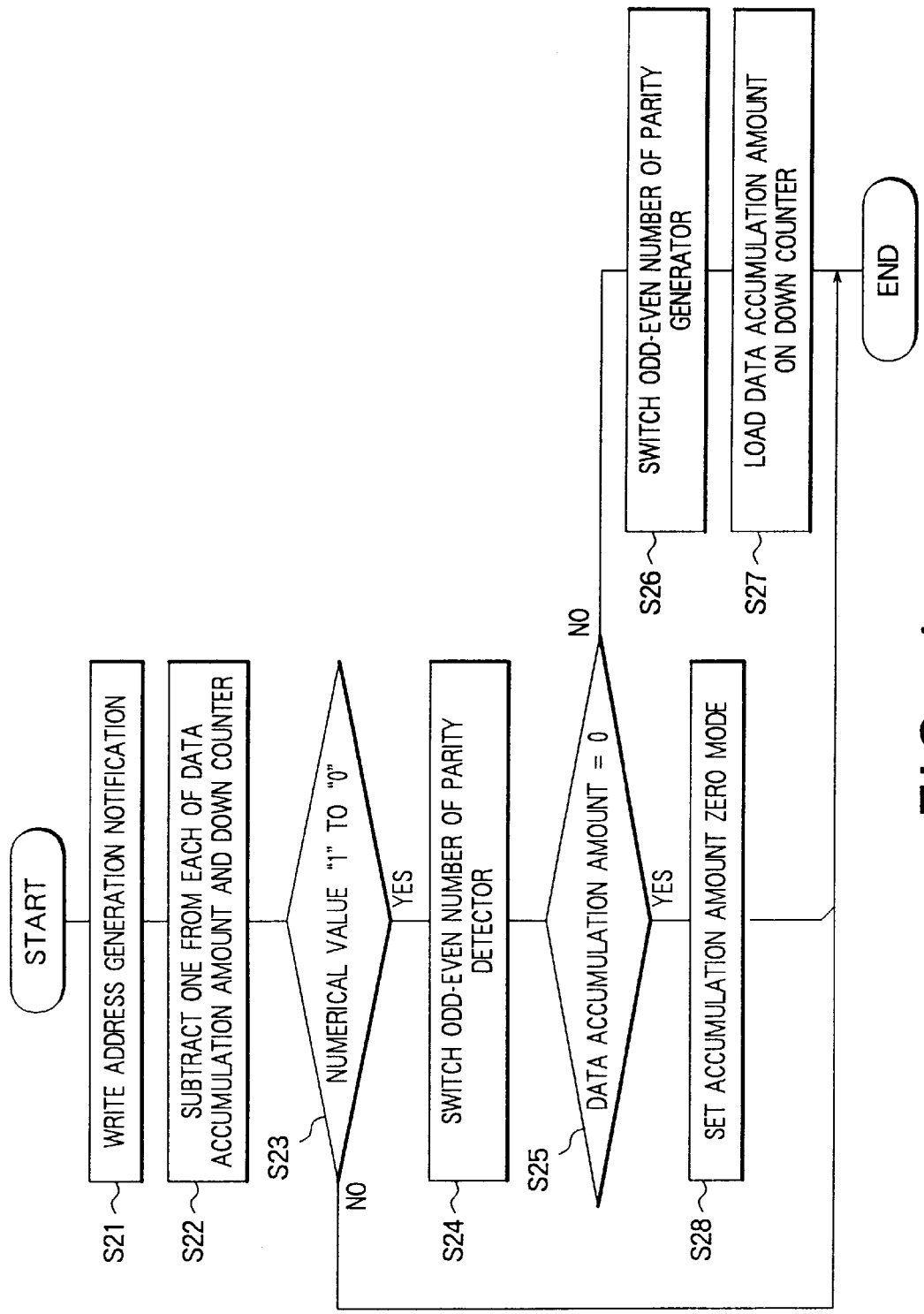
FIG. 4 is a flow chart showing one form of a main operation procedure in a read state in the main signal memory supervisory control system according to the present invention.

Referring to FIG. 4, when a read address is generated by the read address counter 5, the state management section 6 and the down counter 7 receive a generation notification (step S21), one is subtracted from each of the data accumulation amount of the state management section 6 and the count value of the down counter 7 (step S22).

The change point detector 8 supervises the count value of the down counter 7. When the count value changes from numerical value "1" to numerical value "0" by subtraction in step S22 (YES in step S23), the change point detector 8 sends an odd-even switching signal to the parity detector 2 to switch the odd/even number of the parity (step S24).

At the same time, the change point detector 8 supervises the data accumulation of the state management section 6. If the count value changes from numerical value "1" to numerical value "0" (YES in step S23), when the data accumulation amount of the state management section 6 is not numerical value "0" (NO in step S25), the change point detector 8 also sends the odd-even switching signal to the parity generator 1 to switch the odd/even number of the parity (step S26). At the same time, the accumulation amount load signal is sent to the down counter 7 to load the data accumulation amount of the state management section 6 on the counter of the down counter 7 (step S27), and the procedure is ended.

If the count value of the down counter 7 does not change from numerical value "1" to "0" (NO in step S23), the procedure is ended up to this, and the operation does not advance until the next event is generated.

If the data accumulation amount is numerical value "0" (YES in step S25), the change point detector 8 for supervising the data accumulation amount sets an "accumulation amount zero mode" (step S28), and the procedure is temporarily ended.

An operation function in the present invention will be described below by using the concrete example in FIG. 5 with reference to FIGS. 2, 3, and 4.

Figure 5:
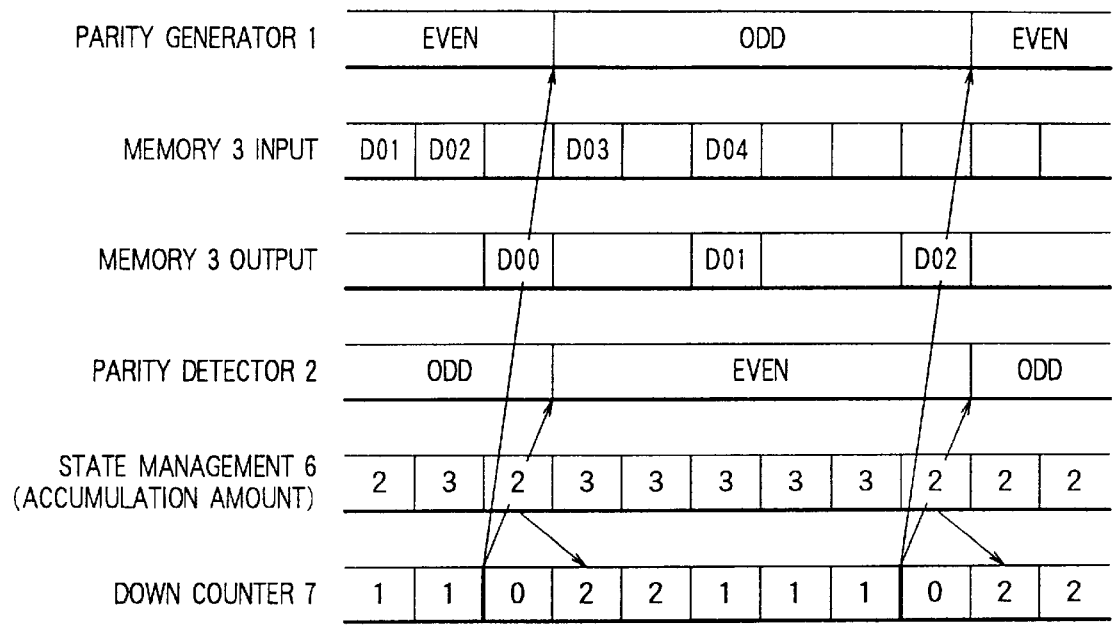
FIG. 5 is a timing chart the embodiment in FIG. 2.
Figure 5:
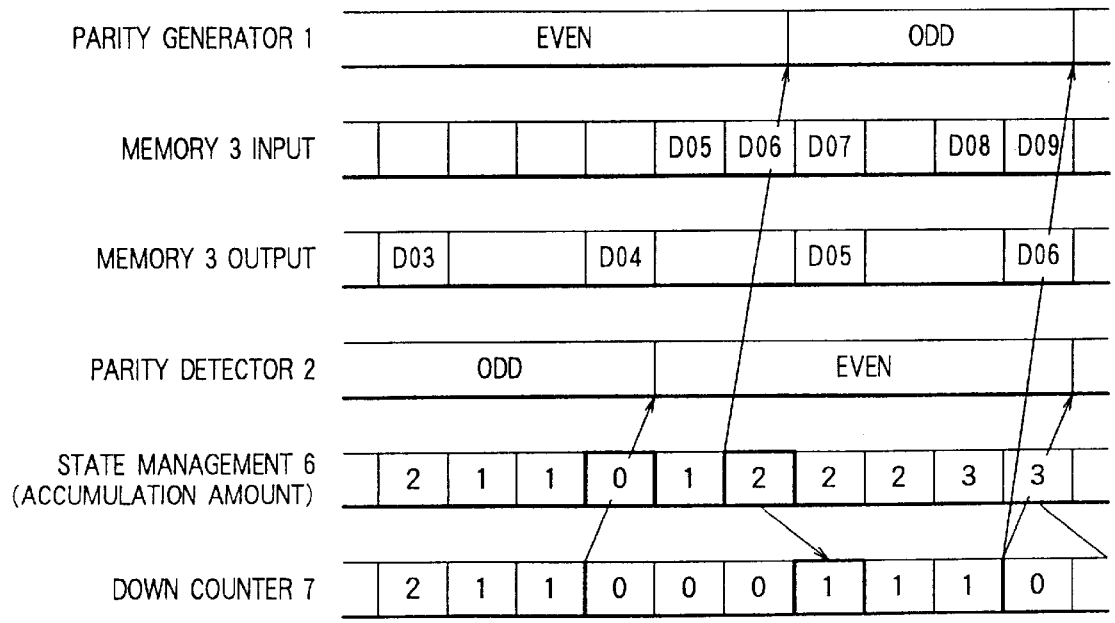

At the start point in FIG. 5, the parity generator 1 generates a parity bit by an even number (EVEN), the parity detector 2 generates a parity check bit by an odd number (ODD), and data D00 is stored in the main signal memory 3. Therefore, assume that the data accumulation amount of the state management section 6 is set to numerical value "1", that the count value of the down counter 7 is set to numerical value "1", and that the predetermined value is set to numerical value "2".

Thereafter, assume that the main signal memory 3 sequentially performs inputting of data D01 and D02, outputting of data D00, inputting of data D03, simultaneous inputting of data D04 and outputting of data D01, outputting of data D02, D03, and D04, inputting of data D05 and D06, simultaneous inputting of data D07 and outputting of data D05, inputting of data D08, and simultaneous inputting of data D09 and outputting of data D06.

Therefore, the data accumulation amount of the state management section 6 changes as numerical values 2, 3, 2, 3, . . . , and the count value of the down counter 7 changes as numerical values 1, 1, 0 . . . .

In this data input/output state, in the first, second, and fourth cases wherein the count value of the down counter 7 changes from numerical value "1" to numerical value "0" (YES in step S23), the data accumulation amount of the state management section 6 in this change is not numerical value "0". For this reason, the odd/even number of the parity is switched in both the parity generator 1 and the parity detector 2 in steps S24 and S26, and the data accumulation amount of the state management section 6 is loaded on the count value of the down counter 7. When data D06 is output from the main signal memory 3, although not shown, numerical value "3" is loaded on the count value of the down counter 7.

In the third case, the data accumulation amount of the state management section 6 in the change is numerical value "0". Steps S26 and S27 are not executed, an odd-even switching signal is sent to only the parity detector 2 in step S24, and an "accumulation amount zero mode" is set by the change point detector 8 in step S28.

Thereafter, data is input to the main signal memory 3, the data accumulation amount of the state management section 6 is added to numerical value "0" in step S12, and the data accumulation amount changes into predetermined numerical value "2". In this case, since the "accumulation amount zero mode" is set, YES is set in step S13. Since the accumulation amount reaches the predetermined value, YES is set in step S14, the oddness/evenness of the parity is switched by the parity generator 1 in step S15, and predetermined value "2" is loaded on the count value of the down counter 7 in step S16.

In the example shown in FIG. 5, when predetermined value "2" is loaded on the count value of the down counter 7, data D05 is read from the main signal memory 3. For this reason, one is subtracted from the count value is subtracted, and the count value becomes numerical value "1". Therefore, numerical value "1" but numerical value "2" is illustrated as the count value of the down counter 7.

The first application of the present invention in a line switch portion of an ATM communication system will be described below with reference to FIG. 6.

The illustrated switch distributes an output from a MUX (multiplexer) 21 which accomodates N lines to multiplex HW (highway) –1 to HW–N to N BMs (buffer memories) 22 corresponding to HW–1 to HW–N in an N direction depending on an output HW number of each data. A read operation depending on an output traffic capacity is performed by the BM22 for each HW.

In this arrangement, the circuit shown in FIG. 2 can be applied to each BM22 in FIG. 6.

Even in a BM23 having a general interface of an ATM communication system using UTOPIA (Universal Test & Operation PHY Interface for ATM) ruled by an ATM forum shown in FIG. 7A, phase control for a data signal for facilitating a signal process on the output side can be performed by the circuit shown in FIG. 2 according to the present invention.

For example, as shown in FIG. 7B, when only effective data, i.e., continuous data D00 and D01, continuous data D02 and D03, data D04, and data D05 are intermittently input as input data, and the input data, i.e., continuous data D00 and D01, continuous data D02, D03, and D04, and data D05 are intermittently sequentially output at a predetermined timing, the present invention can be effectively applied.

Although the functional blocks and procedures are illustratively described, formation of blocks by combining/separating functions to/from each other, changes by parallelly processing/replacing the procedures, and the like can be freely performed if the above functions are satisfied. The present invention is not limited by the above description.

As has been described above, according to the present invention, as the first effect, odd-even alternative switching for a supervisory parity can be performed even in a memory write system such as an ATM communication system using only effective data to improve the supervisory performance of the main signal memory.

The reason why the above effect can be obtained is as follows. That is, the state management section for adding one to the counter due to generation of the write address and subtracting one from the counter due to generation of the read address to measure the data accumulation amount of the main signal memory is arranged, the change point detector sends an odd-even switching signal to the parity generator and the parity detector when the count value of the down counter for subtracting one from the down counter due to generation of the read address changes from numerical value "1" to numerical value "0", and the down counter loads the data accumulation amount of the main signal memory so that the oddness/evenness of a parity bit can be effectively automatically switched at this time by the data accumulation amount in the main signal memory.

In addition, another reason is described as follows. The count value of the down counter changes from numerical value "1" to numerical value "0", and the data accumulation amount of the main signal memory is numerical value "0", the change point detector sends the odd-even switching signal to only the parity detector. Thereafter, when the data accumulation amount of the main signal memory reaches a predetermined value, the change point detector sends the odd-even switching signal to the parity generator, and the down counter loads the predetermined value on the counter of the down counter.

As the second effect following the first effect, detection of a data accumulation amount required for read determination from the main signal memory or a supervising operation for a control circuit based on this detection can be made possible.

The reason why the second effect can be obtained is as follows. That is, the state management section for measuring the data accumulation amount of the main signal memory, the down counter for switching the oddness/evenness of a parity, and the change point detector for supervising the state management section and the numerical value of the down counter to determine the timing of an odd-even switching operation for the parity are arranged, so that the odd-even alternative switching control for the supervisory parity is performed.

What is claimed is:

1. A main signal memory supervisory control system for controlling a supervising operation for a main signal memory by using an odd-even alternative check, comprising:

a parity generator, arranged on a write side of said main signal memory, for adding a parity bit to an input signal to output the signal and switching the oddness/evenness of the added parity bit by an odd-even switching signal;

a parity detector, arranged on a read side of said main signal memory, for detecting a parity bit from a signal read from said main signal memory to check the parity bit and receiving an odd-even switching signal to switch the oddness/evenness of the parity check; and memory supervising means, including a down counter for subtracting a count value each time data is read from said main signal memory, for calculating a data accumulation amount of said main signal memory, loading the data accumulation amount on said down counter when count value "1" changes into numerical value "0", and outputting the odd-even switching signal to said parity generator and said parity detector.

2. A main signal memory supervisory control system for a main signal memory by using an odd-even alternative check according to claim 1, characterized in that said memory supervising means sends the odd-even switching signal to only said parity detector when the data accumulation amount of said main signal memory is numerical value "0" when count value "1" of said down counter is changed into numerical value "0", and, when the data accumulation amount of said main signal memory reaches a predetermined value, said memory supervising means loads the predetermined value on said down counter and sends the odd-even switching signal to said parity generator.

3. A main signal memory supervisory control system for a main signal memory using an odd-even alternative check according to claim 2, characterized in that said memory supervising means loads a value obtained by subtracting numerical value "1" from the predetermined value when data is read from said main signal memory at the same timing as the timing at which the data accumulation amount of said main signal memory reaches the predetermined value.

4. A main signal memory supervisory control system for controlling a main signal memory by using an odd-even alternative check, comprising:

a parity generator, arranged on a write side of said main signal memory, for adding a parity bit to an input signal to output the signal and switching the oddness/evenness of the added parity bit by an odd-even switching signal;

a parity detector, arranged on a read side of said main signal memory, for detecting a parity bit from a read signal to check the parity bit and receiving an odd-even switching signal to switch the oddness/evenness of the parity check;

a write address counter for supplying a write address to said main signal memory;

a read address counter for supplying a read address to said main signal memory;

a state management section for receiving a generation notification of the write address from said write address counter to adding one to a counter of said state management section, receiving a generation notification of the read address from said read address counter to subtract one from the counter of said state management section, and calculating a data accumulation amount of said main signal memory to output the data accumulation amount;

a down counter for receiving the data accumulation amount from said state management section, loading the data accumulation amount on a counter of said down counter when said down counter receives an accumulation amount load signal, subtracting one from the counter of said down counter each time said down counter receives the generation notification of the read address from said read address counter to output the count value; and a change point detector for receiving the count value of said down counter, sending the accumulation amount load signal to said down counter at the time when the count value changes from numerical value "1" to numerical value "0", and sending an odd-even switching signal to said parity generator and said parity detector.

5. A main signal memory supervisory control system using an odd-even alternative check according to claim 4, characterized in that said change point detector receives the data accumulation amount of said main signal memory from said state management section and, sends the odd/even switching signal to only said parity detector in case that the data accumulation amount of said main signal memory received from said state management section is numerical vale "0" at the time when the accumulation amount load signal is sent to said down counter, and then sends the predetermined value load signal to said down counter and sends the odd/even switching signal to said parity generator at the time when the data accumulation amount of said main signal memory reaches a predetermined value, and said down counter loads the predetermined value on a counter of said down counter at the time when said load counter receives the predetermined value load signal.

6. A main signal memory supervisory control system using an odd-even alternative check according to claim 5, characterized in that said down counter loads a numerical value obtained by subtracting numerical value "1" from the predetermined value on the counter of said down counter at the time when said down counter receives a generation notification of a read address from said read address counter at the same timing as the timing at which said down counter receives the predetermined value load signal from said change point detector.

* * * * *